US011756787B2

(12) United States Patent
Martin et al.

(10) Patent No.: US 11,756,787 B2
(45) Date of Patent: Sep. 12, 2023

(54) PROCESS FOR THE HETERO-INTEGRATION OF A SEMICONDUCTOR MATERIAL OF INTEREST ON A SILICON SUBSTRATE

(71) Applicants: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

(72) Inventors: Mickaël Martin, Grenoble (FR); Thierry Baron, Saint-Egreve (FR); Virginie Loup, Grenoble (FR)

(73) Assignees: COMMISSARIAT A L'ENERGIE ATOMIQUE ET AUX ENERGIES ALTERNATIVES, Paris (FR); CENTRE NATIONAL DE LA RECHERCHE SCIENTIFIQUE, Paris (FR); UNIVERSITE GRENOBLE ALPES, Saint Martin d'Heres (FR)

( * ) Notice: Subject to any disclaimer, the term of this patent is extended or adjusted under 35 U.S.C. 154(b) by 82 days.

(21) Appl. No.: 17/068,756

(22) Filed: Oct. 12, 2020

(65) Prior Publication Data
US 2021/0111022 A1 Apr. 15, 2021

(30) Foreign Application Priority Data
Oct. 15, 2019 (FR) ........................................ 1911447

(51) Int. Cl.
*H01L 21/02* (2006.01)
*H01L 29/06* (2006.01)

(52) U.S. Cl.
CPC .... *H01L 21/02499* (2013.01); *H01L 21/0262* (2013.01); *H01L 21/02381* (2013.01);
(Continued)

(58) Field of Classification Search
CPC ......... H01L 21/02499; H01L 21/02381; H01L 21/02433; H01L 21/0262; H01L 29/0603; H01L 21/02639
See application file for complete search history.

(56) References Cited

U.S. PATENT DOCUMENTS

2015/0206796 A1\* 7/2015 Dasgupta .............. H01L 29/045
438/478
2015/0311072 A1\* 10/2015 Aagesen ........... H01L 21/02538
257/618
(Continued)

FOREIGN PATENT DOCUMENTS

FR 3 010 828 A1 3/2015
FR 3010828 A1 3/2015

OTHER PUBLICATIONS

Palmer, et al., "Layered Structure GaSe as a Thermal Lattice Mismatch Buffer Layer in the GaAs/SiHeteroepitaxial System", Extended Abstracts of the 1992 International Conference on Solid State Devices and Materials, pp. 302-303 Aug. 1, 1992.
(Continued)

*Primary Examiner* — David Vu
*Assistant Examiner* — Brandon C Fox
(74) *Attorney, Agent, or Firm* — BakerHostetler (57) ABSTRACT

A process for the hetero-integration of a semiconductor material of interest on a silicon substrate, includes a step of structuring the substrate which comprises a step of producing a growth mask on the surface of the silicon substrate, the growth mask comprising a plurality of masking patterns, two masking patterns being separated by a trench wherein
(Continued)

the silicon substrate is exposed; a step of forming a two-dimensional buffer layer made of a 2D material, the buffer layer being free of side bonds on its free surface and being formed selectively on at least one silicon plane of [111] orientation in at least one trench, the step of forming a buffer layer being performed after the structuring step; a step of forming at least one layer of a semiconductor material of interest on the buffer layer. The semiconductor material of interest is preferably a IV-IV, III-V, II-VI semiconductor material and/or a 2D semiconductor material.

16 Claims, 6 Drawing Sheets

(52) U.S. Cl.
CPC .. *H01L 21/02433* (2013.01); *H01L 21/02639* (2013.01); *H01L 29/0603* (2013.01)

(56) References Cited

U.S. PATENT DOCUMENTS

| | | |
|---|---|---|
| 2016/0308041 A1 | 10/2016 | Then et al. |
| 2017/0047223 A1* | 2/2017 | Wang ............... H01L 21/02381 |
| 2017/0194476 A1* | 7/2017 | Brueck ............ H01L 21/02494 |
| 2018/0350591 A1* | 12/2018 | Wu ..................... H01L 21/0262 |
| 2021/0159338 A1* | 5/2021 | Chang ................ H01L 29/7833 |

OTHER PUBLICATIONS

Kunert et al., "How to control defect formation in monolithic III/V hetero-epitaxy on (100) Si? A critical review on current approaches", Semicond. Sci. Technol. 33, 093002, 2018.

* cited by examiner

PROCESS FOR THE HETERO-INTEGRATION OF A SEMICONDUCTOR MATERIAL OF INTEREST ON A SILICON SUBSTRATE

CROSS-REFERENCE TO RELATED APPLICATIONS

This application claims priority to foreign French patent application No. FR 1911447, filed on Oct. 15, 2019, the disclosure of which is incorporated by reference in its entirety.

FIELD OF THE INVENTION

The invention lies in the field of the hetero-integration of semiconductor materials on a silicon substrate, and more precisely relates to the monolithic hetero-integration of semiconductors (IV-IV, III-V, II-VI, 2-D materials, etc.) by epitaxy on a silicon substrate.

Among the numerous applications of the invention, mention may be made of microelectronics, photonics, sensors, radiofrequency-related technologies, microsystems (MEMS), Internet-of-things components and more broadly anything concerning "more than Moore" applications or derivative technologies, i.e. technologies which integrate several functions on the same silicon chip.

BACKGROUND

Silicon (Si) is the most widespread semiconductor in information technology applications and dominates the microelectronic and nanoelectronic industry. Its highly mature technology for the manufacture of integrated circuits (IC) has undergone astounding progress in terms of miniaturization and performance enhancement.

Moreover, other semiconductors such as IV-IV, III-V, II-VI semiconductors and 2-D materials may have electronic and/or optical properties complementary to those of silicon.

IV-IV semiconductors are composite semiconductors manufactured from several elements from column IV of the Periodic Table of the Elements, for example: Si, Ge, C. Examples of IV-IV semiconductors that may be mentioned include: SiC, SiGe, etc.

III-V semiconductors are composite semiconductors manufactured from one or more elements from column III of the Periodic Table of the Elements (for example: Al, Ga, In) and from one or elements from column V of the Periodic Table of the Elements (for example: As, Sb, N, P). Examples of III-V semiconductors that may be mentioned include: GaAs, GaSb, GaN, AlN, InP, etc.

II-VI semiconductors are composite semiconductors manufactured from one or more elements from column II of the Periodic Table of the Elements (for example: Cd) and from one or elements from the chalcogen group (column VI) of the Periodic Table of the Elements (for example: S, Se, Te). Examples of II-VI semiconductors that may be mentioned include: CdS, CdSe, CdTe.

III-V semiconductors notably are materials of choice for optoelectronic devices. The majority of the III-V semiconductors have a direct band structure, which implies better photon emission and absorption than indirect gap semiconductors such as silicon (Si) and germanium (Ge). Thus, light-emitting devices such as LEDs and lasers are mainly based on III-V materials. Similarly, light-absorbing devices such as photovoltaic detectors, sensors and components benefit from the optoelectronic properties of III-V materials.

Moreover, a large number of III-V materials have high carrier (electrons, holes) mobilities enabling the production of high-performance logic and radiofrequency (RF) transistors.

The term "2D material" means a material consisting of a sheet a few atoms thick, typically a maximum of 10 atoms. These materials are electronically saturated. Stacking of several of these sheets thus takes place by means of van der Waals bonds. Among the 2D materials, some are semiconductors. Their very low thickness gives rise to highly unusual electronic and optoelectronic properties.

The monolithic hetero-integration of semiconductors of interest (IV-IV, III-V, II-VI, 2D materials, etc.) by epitaxy on a silicon substrate is a very promising way for adding novel functionalities (electronic, optical, mechanical, sensor, biological, etc.) to CMOS (complementary metal oxide semiconductor) integrated circuits of highly mature technology based on silicon, thus opening up a wide field of applications and functionalities.

Monolithic hetero-integration involves the direct deposition by epitaxy of layers of a semiconductor material (IV-IV, III-V, II-VI, 2D material, etc.) on a silicon substrate.

However, epitaxy on a silicon substrate raises numerous difficulties, the main ones being:
the difference in thermal expansion coefficient between silicon and the semiconductor material to be epitaxially grown which may lead to deformation of the epitaxial semiconductor layer, which may give rise to curvature of the substrate or even the creation of cracks in the epitaxial layer; the difference in lattice parameter between the semiconductor material to be epitaxially grown and silicon which induces constraints in the epitaxial layer, these constraints relaxing by creation of crystal defects forming dislocations at the interface between the epitaxial layer and silicon. These dislocations may propagate in the epitaxial layer (emerging dislocations or threading dislocations (TD(s)));
the difference in polarity between silicon and the epitaxial layer may lead to the formation of planar defects, the anti-phase walls.

These crystal defects generated at the interface are a source of major degradation of the electronic and optical properties of the epitaxial materials.

Among these defects, threading dislocations are currently the defects that are the most difficult to overcome.

Several solutions are proposed in the literature for epitaxially growing a layer of semiconductor material of good crystalline quality. The solutions generally consist in selectively epitaxially growing the semiconductor layer in a mask comprising dielectric patterns (generally made of $SiO_2$) pre-structured on the silicon substrate. These solutions have the generic name "Selective Area Epitaxy" (SAE) or "Selective Area Growth" (SAG). The semiconductor layer is generally deposited by MOCVD. SAE solutions offer several advantages:
the growth takes place only in the open areas (denoted as "trenches") between the patterns (emerging on the Si surface); the semiconductor material can thus be deposited solely in the areas of interest, which is very important for co-integration with Si-based devices;
the deposition of materials in very confined apertures leads to a reduction of the dislocations which are trapped by the walls of the patterns of the mask;
the curvature of the substrate and the appearance of cracks in the layer, caused by the differences in thermal expansion coefficients, can be attenuated.

Several variants of these solutions are presented in the publication How to control defect formation in monolithic III/V hetero-epitaxy on (100) Si? A critical review on current approaches; Kunert B. et al., 2018 Semicond. Sci. Technol. 33 093002.

Figure 1:
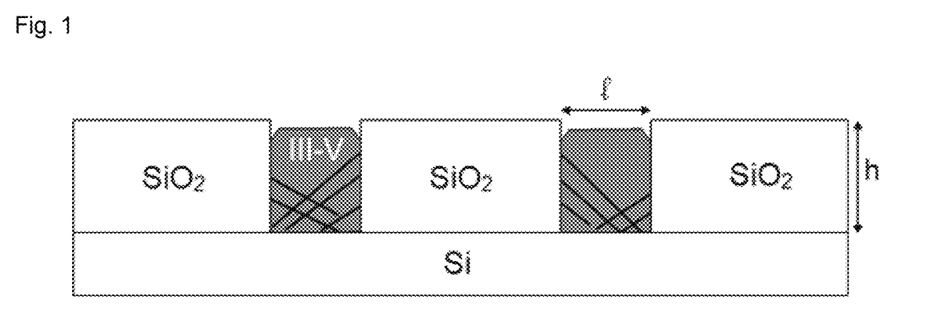
FIG. 1 represents a first variant of selective epitaxial growth according to the prior art.

A first variant consists in growing the materials in dielectric trenches. It is known by the abbreviation ART, meaning Aspect Ratio Trapping, illustrated in FIG. 1. It consists in trapping the threading dislocations of the III-V semiconductor layer against the walls of the dielectric mask ($SiO_2$) if the aspect ratio (AR), corresponding to the height (h) of the mask divided by the width (l) of the trench is sufficient. This first variant is relatively simple to implement, but its main limitation is that the threading dislocations parallel to the trenches are not trapped by the walls. Thus, the density of threading dislocations remains high, with, as best results, saturating values of about $10^7$ $cm^{-2}$.

Patent FR 3010828, for example, relates to a process for manufacturing III-V semiconductor material patterns on a silicon-based or germanium-based semiconductor substrate, comprising: a step of producing a growth mask on the surface of the substrate and a step of growing patterns of III-V material between the masking patterns. For this growth step, optimized parameters are determined so as to grow III-V materials with trapped threading dislocations and thus to produce layers of good crystalline quality having a low dislocation density.

Figure 2A:
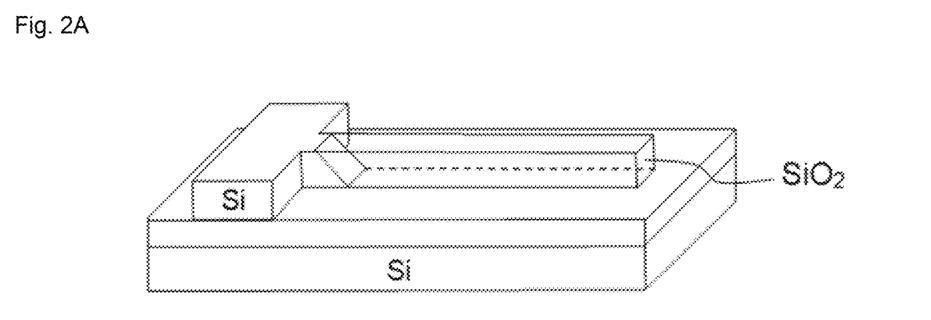
FIG. 2A and FIG. 2B represent a second variant of selective epitaxial growth according to the prior art.
Figure 2B:
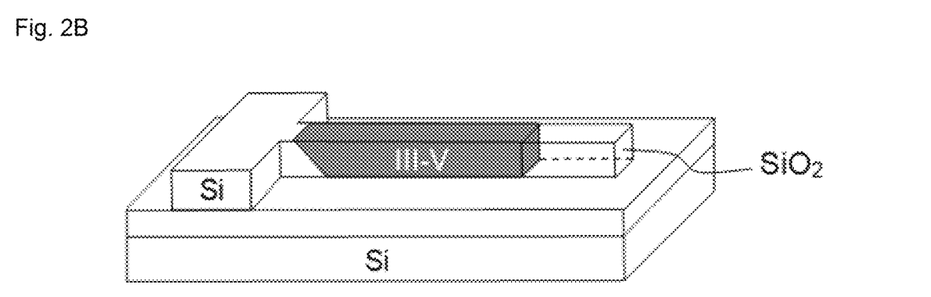

A second variant is known under the term "growth in dielectric tubes", also known as TASE, meaning Template-Assisted Selective Epitaxy, illustrated in FIGS. 2A and 2B.

Figure 3:
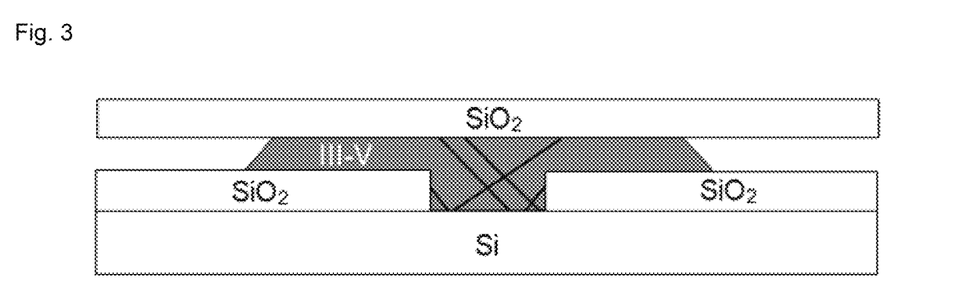
FIG. 3 represents a third variant of selective epitaxial growth according to the prior art.

A third variant, similar in principle to TASE, is known as CELO, meaning Confined Epitaxial Lateral Overgrowth, illustrated in FIG. 3. It consists first in growing the material in trenches (in the same manner as for ART) and then in forcing the layer to grow laterally by means of a second confinement, this time height-wise, which encapsulates the layer. Horizontal ART is thus added to the vertical ART. This second confinement makes it possible to trap the residual TDs which have not been blocked by the walls of the trenches.

Although the second and third variants make it possible to trap more (or even the vast majority of) threading dislocations and thus to reduce the density of threading dislocations, they nevertheless have drawbacks:
  the technological process for structuring the substrate is very laborious to implement, notably with a large number of steps to perform;
  as the contact surface between the epitaxial material and the dielectric is very large, the dielectric must be of very good quality to avoid defects;
  epitaxy in dielectric tubes is difficult to control, in particular for ternary and quaternary alloys for which fluctuation of the alloy composition is observed.

SUMMARY OF THE INVENTION

The invention is directed towards providing a process for the monolithic hetero-integration of semiconductors of interest (IV-IV, III-V, II-VI, 2D materials, etc.) by selective epitaxy on a silicon substrate, without the abovementioned drawbacks of the prior art.

More particularly, the invention is directed towards providing a process for the monolithic hetero-integration of semiconductors of interest (IV-IV, III-V, II-VI, 2D materials, etc.) by selective epitaxy on a silicon substrate, which makes it possible to reduce the defects generated at the interface between silicon and the epitaxial layer, in particular dislocations, and which is relatively simple to perform.

A first subject of the invention for overcoming these drawbacks is a process for the hetero-integration of a semiconductor material of interest on a silicon substrate, characterized in that it comprises:
  a step of structuring the substrate which comprises a step of producing a growth mask on the surface of the silicon substrate, said growth mask comprising a plurality of masking patterns, two masking patterns being separated by a trench in which the silicon substrate is exposed;
  a step of forming a two-dimensional buffer layer made of a 2D material, said buffer layer being free of side bonds on its free surface and being formed selectively on a silicon plane of [111] orientation in at least one trench, said step of forming a buffer layer being performed after the structuring step and being performed by the organometallic vapour deposition (MOCVD) technique;
  a step of forming at least one layer of a semiconductor material of interest on the buffer layer.

The semiconductor material of interest is preferably a IV-IV, II-VI semiconductor material and/or a 2D semiconductor material.

According to one embodiment, the buffer layer is formed selectively on a silicon plane of [111] orientation in each trench.

According to the invention, the terms "selective", "selectively" and similarly "selective growth" and "selective passivation" are defined in the SAG sense, namely in trenches of a growth mask.

According to the invention, a "2D material" denotes a material consisting of a sheet a few atoms thick, typically a maximum of 10 atoms thick, with strong bonds between the atoms in the plane of the sheet, and weak bonds of van der Waals type outside the plane of the sheet. It may also be referred to as "two-dimensional material" or "lamellar material". Similarly, a "two-dimensional layer" denotes a layer made with a 2D material, thus a material consisting of a sheet of atoms containing strong bonds in the plane of the sheet, and weak van der Waals bonds outside the plane of the sheet, for example between two sheets or on a free sheet surface. A material which is not structured in sheets but with ionic or covalent bonds throughout its volume may also be denoted as a "3D material", for example a conventional semiconductor material.

The invention is a process for selectively growing by MOCVD, a two-dimensional buffer layer, without covalent or side bonds, in trenches of a growth mask, preferably made of dielectric, on a silicon substrate, which may be a standard Si(001) (also denoted as Si(100)) silicon substrate or an Si(111) silicon substrate.

The two-dimensional buffer layer is made from a two-dimensional material, with suitable operating conditions. It may then function as a universal substrate for the localized growth of any type of semiconductor of interest with a reduced defect content (notably a reduced density of threading dislocations) and thus having optimized physicochemical properties. Specifically, contrary to direct growth on a silicon substrate, growth on a two-dimensional buffer layer makes it possible to overcome the difference in lattice parameters. It is done without any, or with very few, covalent or side bonds at the interface. The formation of this two-dimensional buffer layer is in fact performed by promoting van der Waals epitaxial growth, thus enabling the formation of an unconstrained material, which avoids the process of relaxation by generation of threading dislocations. This thus makes it possible to form a layer of a semiconductor material of interest which is a crystalline material with a density of threading dislocations of less than $10^6/cm^2$.

Among the advantages of the process of the invention, mention may be made of:
- the production of a semiconductor layer by hetero-epitaxy on a standard silicon substrate, such as Si(100) 300 mm used in the microelectronics industry, having a low density of crystal defects;
- the simplicity and the low cost of a process requiring very few steps and which can performed with standard means;
- the versatility of the technique: growth of all types of semiconductors and hetero-structures may be envisaged (IV-IV, III-V, II-VI, hetero-structures of 2D materials, etc.), irrespective of the difference in lattice parameter or of crystal structure with silicon.

In addition, growth of a 3D semiconductor material (GaAs, GaN, etc.) on a 2D material is generally very difficult on a silicon substrate not structured as dielectric masking patterns, on account of the low nucleation of the adatoms arriving at the surface (due to the absence of side bonds of the 2D material). The term "adatom" means an atom adsorbed onto the surface of the substrate. This results in growth as sparse islets on the surface. The process according to the invention which is selective growth in trenches of the growth mask makes it possible to concentrate the nucleation on a very limited number of areas of the substrate: the nucleation density is thereby considerably enhanced and notably allows the growth of a continuous layer of a 3D material on a 2D material.

The very low density of threading dislocations thus allows the co-integration of efficient electronic components, optoelectronic components, sensors and imaging components and in general any "more than Moore" component on a silicon substrate of [001] orientation, or even of [111] orientation, which is notably compatible with CMOS technology.

Preferably, the masking patterns are made of a dielectric material.

According to one embodiment, the silicon substrate is a silicon substrate of [001] orientation. In this case, the structuring step also comprises a step of forming a silicon facet of [111] orientation in the silicon substrate, so as to form at least one silicon plane of [111] orientation. Each facet is made via a trench, i.e. in the silicon substrate which is exposed at the bottom of the trench.

A facet may have an inclined surface with an angle of less than 90° relative to the surface of the silicon substrate in which said facet is formed.

According to a particular embodiment, two silicon facets of [111] orientation are formed in a trench, each facet having an inclined surface with an angle of less than 90° relative to the surface of the silicon substrate in which said facet is formed. Two facets may thus notably form a V, the first segment of which forms an angle of +54.7° relative to the surface of the substrate and the second segment of which forms an angle of −54.7° relative to the surface of the substrate.

The step of forming a facet may comprise a step of chemical etching of the silicon substrate, for example chemical etching based on tetramethylammonium hydroxide, tetraethylammonium hydroxide, ammonia, potassium hydroxide or sodium hydroxide.

According to one embodiment, the silicon substrate is a silicon substrate of [111] orientation, the surface of said substrate forming the silicon plane of [111] orientation.

According to one embodiment, the process also comprises a passivation step which consists in depositing an atomic double plane of gallium and selenium onto the silicon plane of [111] orientation so as to form a silicon-gallium-selenium passivated surface on said silicon plane. The passivated surface may also be referred to as a "passivation layer".

According to a particular embodiment, the passivation step is performed between the structuring step and the step of forming the buffer layer.

The passivation step may comprise a step of vapour deposition with organometallic precursors (MOCVD).

The organometallic precursors may be TriMethylGallium (TMGa) and DiisoPropylSelenium (DiPSe).

According to one embodiment, the step of forming at least one buffer layer consists of van der Waals epitaxy and comprises:
- a first step of nucleating a 2D material on the passivated surface; and
- a first step of growth of the nuclei obtained on conclusion of the first nucleation step.

The first nucleation step may comprise a step of vapour deposition with organometallic precursors (MOCVD).

The organometallic precursors may be TriMethylGallium (TMGa) and DiisoPropylSelenium (DiPSe).

According to one embodiment, the step of preparing at least one layer of a semiconductor material of interest consists of an additional epitaxy step comprising:
- a second step of nucleating the semiconductor of interest on the buffer layer; and
- a second step of growth of the nucleation layer obtained on conclusion of the second nucleation step.

The second nucleation step may comprise a step of vapour deposition with organometallic precursors (MOCVD).

According to one embodiment, the process also comprises at least one step of removing the native oxide, for example by chemical attack with hydrofluoric acid, prior to the step of forming the buffer layer or the passivation step.

The width of a trench is generally less than or equal to 20 micrometres and is preferably less than or equal to 2 micrometres.

The 2D material of the buffer layer may be chosen from GaSe, GaS, GaTe, $MoS_2$, $MoSe_2$, $WS_2$, $WSe_2$, InSe or a combination of said materials.

The semiconductor material of interest may be chosen from GaAs, GaSb, GaN and AlN.

A second subject of the invention is a structure obtained via the hetero-integration process according to the first subject of the invention, said structure comprising:
- a silicon substrate;
- a plurality of masking patterns located on the silicon substrate, two masking patterns being separated by a trench;
- a two-dimensional buffer layer located in each trench;
- a layer of a semiconductor material of interest located on the two-dimensional buffer layer and at least in each trench, said layer of a semiconductor material of interest having a density of threading dislocations of less than $10^6/cm^2$.

Preferably, the semiconductor material of interest is a IV-IV, III-V, II-VI semiconductor material and/or a 2D semiconductor material.

Preferably, the masking patterns are made of a dielectric material.

Advantageously, the structure also comprises a passivation layer made of silicon-gallium-selenium between the silicon substrate and the two-dimensional buffer layer.

BRIEF DESCRIPTION OF THE DRAWINGS

Other characteristics and advantages of the invention will become apparent with the aid of the following description given for illustrative purposes and without any implied limitation, with reference to the appended figures, among which.

DETAILED DESCRIPTION

FIGS. 1, 2A, 2B and 3 (prior art) have been described previously and will not be repeated here.

Figure 4A:
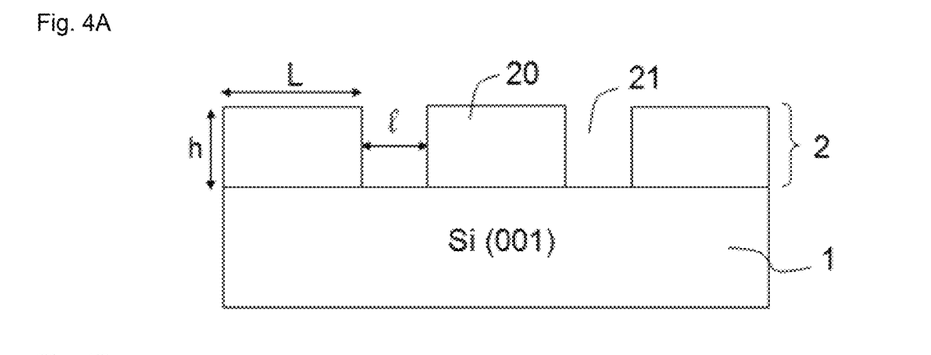
FIG. 4A-FIG. 4N represent an example and variants of the hetero-integration process according to the invention.
Figure 4B:
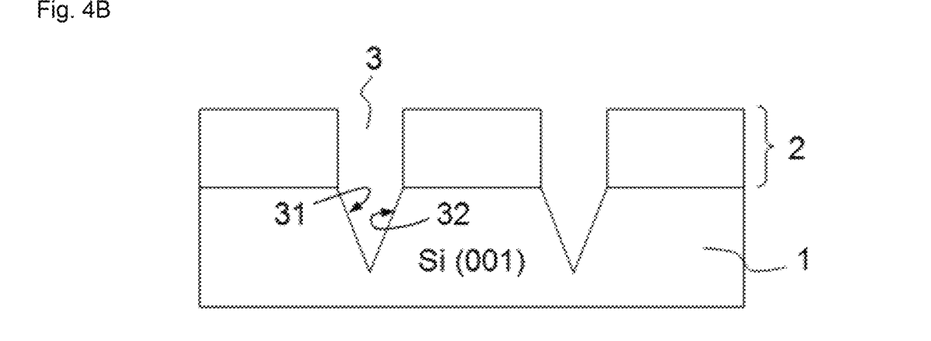
Figure 4C:
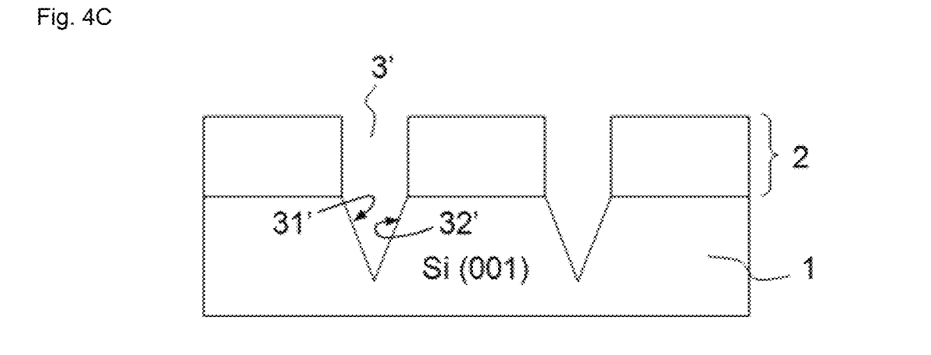
Figure 4D:
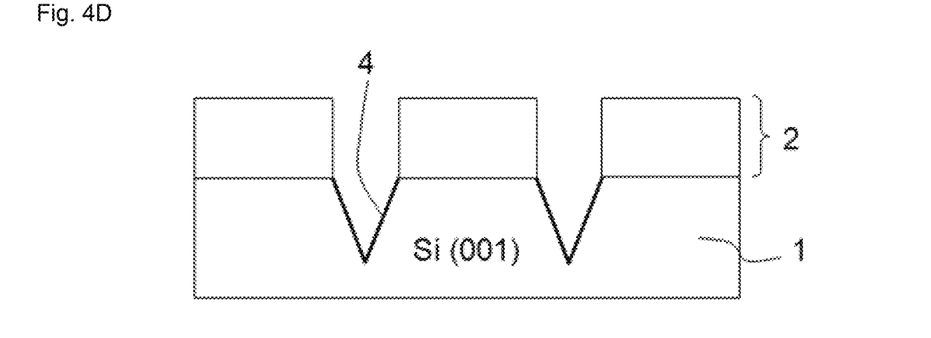
Figure 4E:
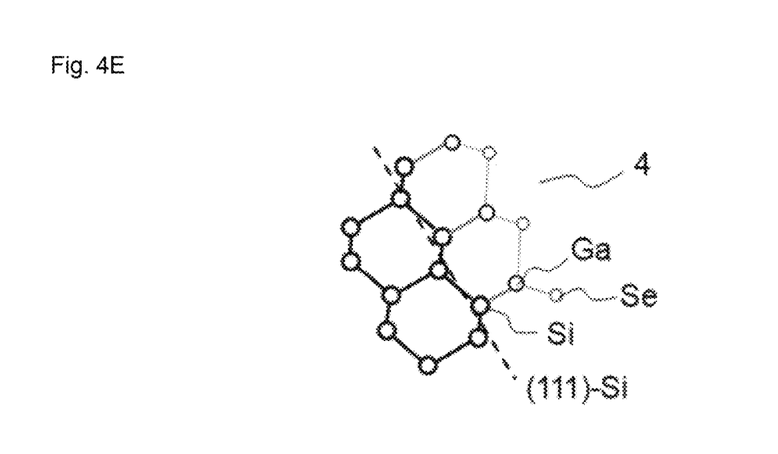
Figure 4F:
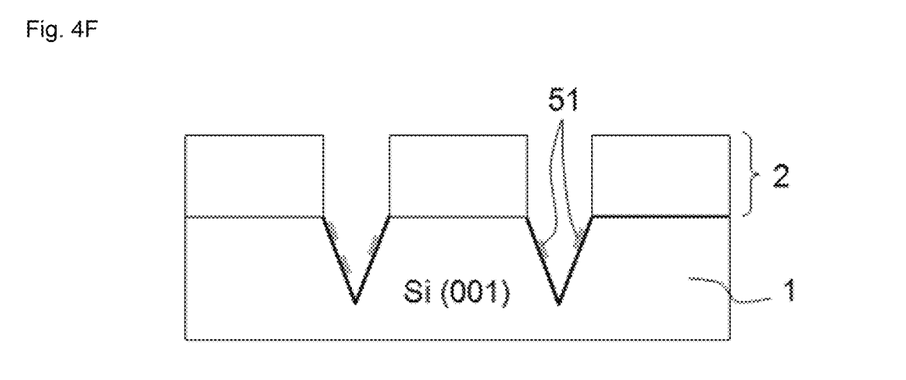
Figure 4G:
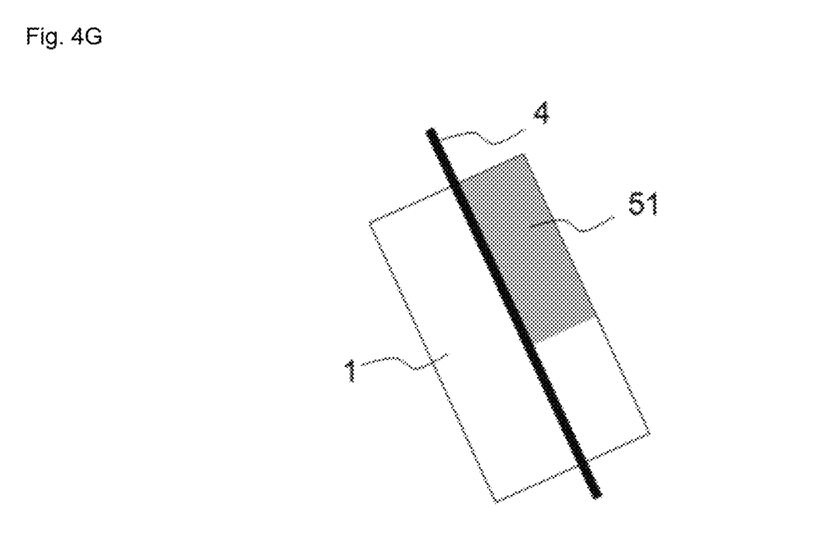
Figure 4H:
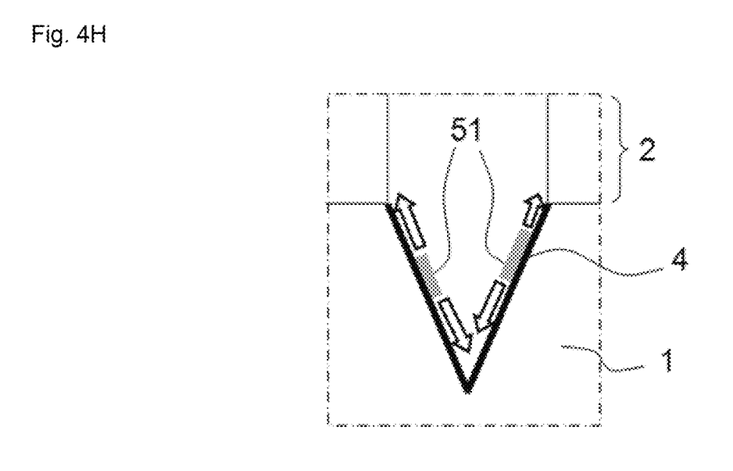
Figure 4I:
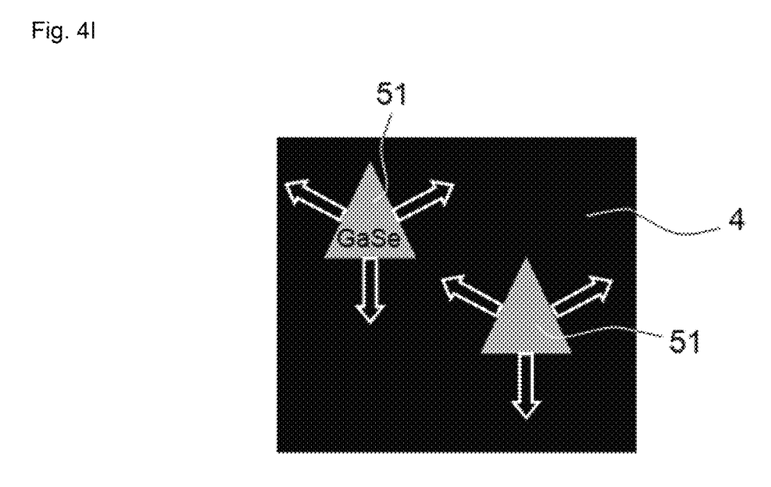
Figure 4J:
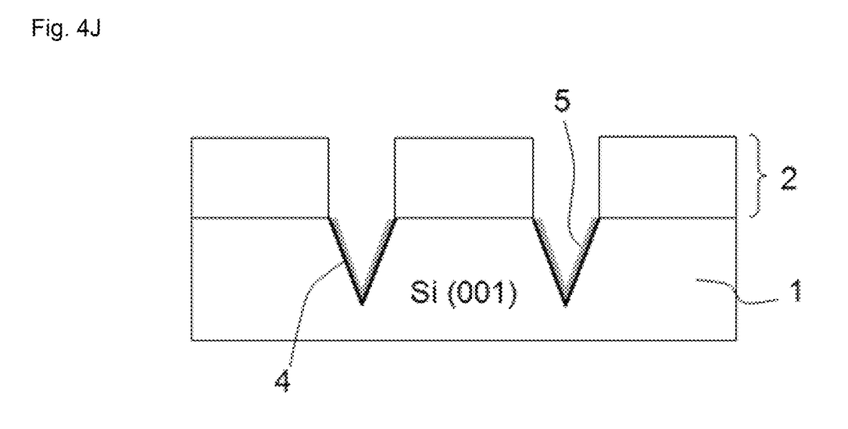
Figure 4K:
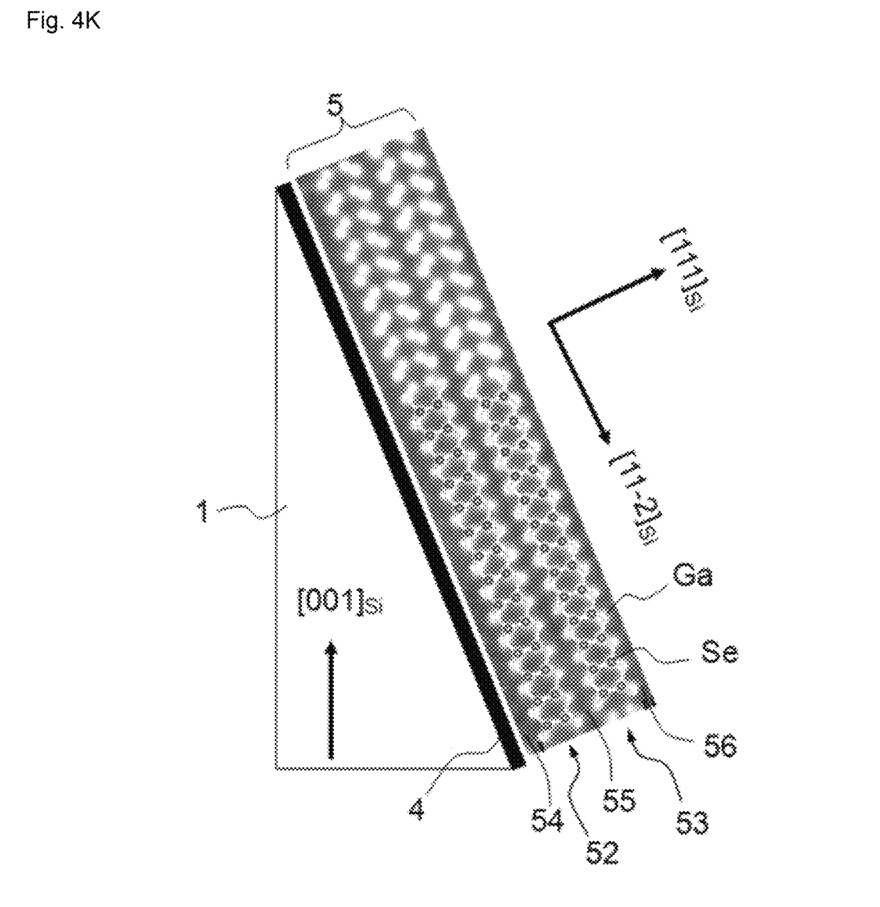
Figure 4L:
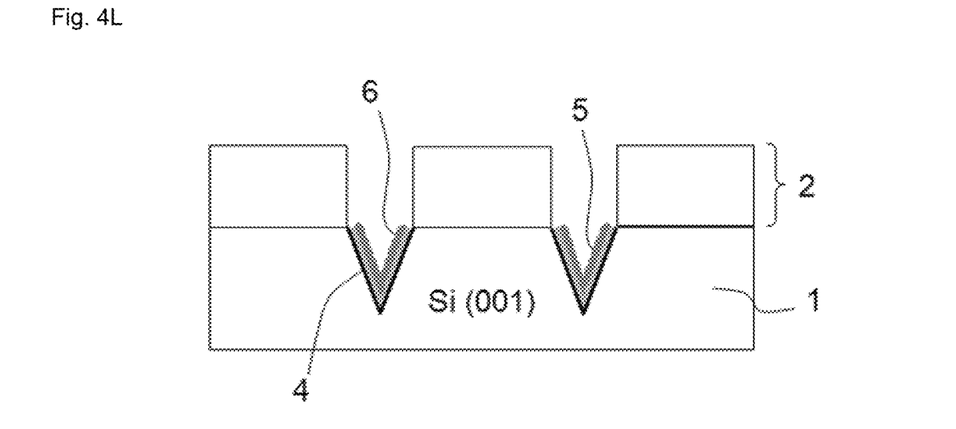
Figure 4M:
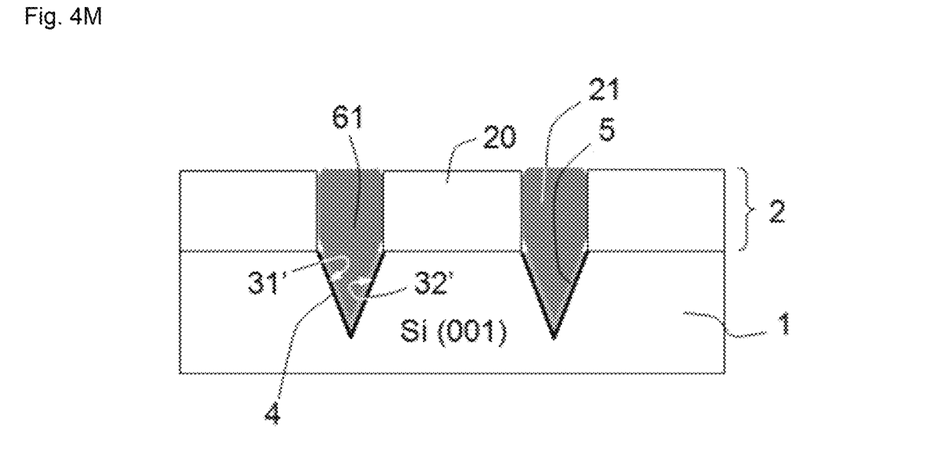
Figure 4N:
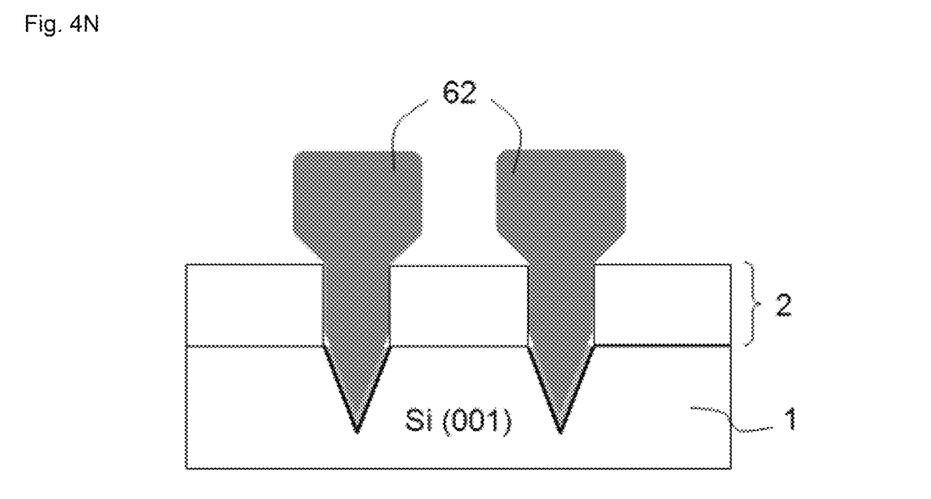

FIGS. 4A to 4N represent an example and variants of the hetero-integration process according to the invention. In this example, the starting silicon substrate 1 has a [001] crystal orientation and may thus be denoted as Si(001).

The process comprises a step of structuring the [001] oriented silicon substrate, which comprises a step of making a growth mask 2 on the surface of said substrate (FIG. 4A). The growth mask 2 comprises masking patterns 20. The growth mask is preferably made of a dielectric material, generally $SiO_2$ or SiN, which shows selectivity towards etching relative to the silicon substrate. Two consecutive (or adjacent) masking patterns are separated from each other by a distance l. This distance l corresponds in this example to the width of a trench 21. A trench corresponds to an area of the substrate 1 not masked with the dielectric material (or "exposed area").

The masking patterns may be made starting with a silicon substrate, by performing a thermal oxidation of said substrate, making it possible to deposit an upper layer of silicon oxide ($SiO_2$ layer), and then by defining trenches by lithography and etching into the $SiO_2$ layer so as to expose the silicon surface at the bottom of each trench.

At this stage of the process, the trenches have a depth h and a width l (distance between two patterns). The width l of a trench may be between a few tens of nanometres and 20 micrometres. Preferably, the width l of a trench is less than 2 micrometres. The length L of the masking patterns may be greater than several tens of micrometres.

According to the example shown in FIG. 4B, the structuring step comprises a step of chemical etching of the silicon substrate 1 in each trench 21 so as to form silicon facets 31, 32 having a [111] orientation which may be denoted as Si(111). The Si(111) facets form V-shaped grooves in the silicon substrate 1.

The chemical etching may be anisotropic and performed with solutions based on tetramethylammonium or tetraethylammonium hydroxide diluted in water, with ammonia, potassium hydroxide or sodium hydroxide. The temperatures of the solutions during the etching step conventionally range between 20° C. and 100° C.

Prior to the chemical etching, a first step of removing the native oxide (not shown) may be necessary, notably depending on the chemical etching solutions used. This first step of removing the native oxide is generally performed by chemical attack with hydrofluoric acid (HF), typically by exposing the substrate to a dilute hydrofluoric acid solution (for example at a volume concentration of 0.2% to 1%) for 30 to 90 seconds.

After the chemical etching step, the structuring step comprises a second step of removing the native oxide from the silicon so as to obtain deoxidized Si(111) facets 31', 32', as shown in FIG. 4C. This second step of removing the native oxide is generally performed by chemical attack with hydrofluoric acid (HF), typically with a dilute hydrofluoric acid solution (for example at a volume concentration of 0.5%) for 30 to 60 seconds.

The chemical etching step to form the Si(111) planes is not necessary if a [111] oriented silicon substrate is used instead of the Si(001) substrate.

The chemical etching step is notably not necessary if a silicon substrate is available which already has at least one silicon plane of [111] orientation: this may mean that the surface of the substrate is made of Si(111), or that the Si(001) substrate already comprises Si(111) facets.

In the case of an Si(111) substrate, the growth mask may be designed on said silicon substrate so that the masking patterns leave parts of the Si(111) substrate exposed. The steps described below may then be performed.

More generally, irrespective of the orientation of the silicon substrate, the masking patterns must leave [111] oriented silicon planes exposed.

In the case of an Si(001) substrate, the [111] oriented planes will typically form a V, the first segment of which forms an angle of +54.74° relative to the substrate and the second segment of which forms an angle of −54.74° relative to the substrate.

In the case of an Si(111) substrate, the exposed Si(111) planes will be substantially at 0° relative to the surface of the substrate.

The process then comprises a step of selective passivation of the Si(111) facets, consisting in depositing on said facets an atomic plane of gallium followed by an atomic plane of selenium (FIG. 4D). This makes it possible to obtain the formation of a passivated silicon surface (also denoted as the "passivation layer" 4) made of Si—Ga—Se, as illustrated in FIG. 4E. This surface is electronically saturated and is stable at high temperature (up to about 650-700° C.). This passivation layer 4 then makes it possible to grow a 2D material by van der Waals epitaxy, as described below.

An atomic plane of Ga thus bonded to an atomic plane of Se may be called an "atomic biplane" and may be seen as a half-sheet of the "2D GaSe" material. Specifically, 2D GaSe denotes two-dimensional gallium selenide (as a sheet) consisting of four atomic planes of sequence Se—Ga—Ga—Se.

The term "electronically passivated surface" or "passivation layer" or "electronically saturated surface" means a surface without side bonds: the gallium and selenium atoms of which the passivation layer is composed have all their valency electrons paired.

To perform this passivation step, the silicon substrate is typically introduced into a growth chamber and the GaSe atomic biplane is deposited via the organometallic vapour deposition technique "MOCVD" (meaning Metal Organic Chemical Vapour Deposition). The MOCVD technique is performed by transporting Ga and Se precursors which are introduced into the growth chamber via a carrier gas, so as to form the passivation layer on the Si(111) facets which are in the trenches of the growth mask (and thus exposed).

To obtain the Si—Ga—Se passivation layer by MOCVD, use is made of organometallic precursors introduced simultaneously into the chamber, which are typically TriMethyl-Gallium (TMGa) and DiisoPropylSelenium (DiPSe), which are gaseous at the working temperature in the process. Alternatively, it may be any other gallium precursor and/or any other selenium precursor.

The carrier gas is typically hydrogen. Alternatively, it may be nitrogen or argon, or any other inert gas from column VIII of the Periodic Table.

The passivation step is generally performed at between 400° C. and 650° C.

The total pressure is adapted as a function of the chamber geometry, but typical values are between 5 and 200 Torr.

The partial pressure of the gallium precursor is generally between 1 and 200 mTorr.

The III/VI molar flow ratio (group III precursor/group VI precursor) is generally between 1 and 10.

According to a particular embodiment, the conditions of the passivation step are:
total pressure in the chamber: 10-20 Torr;
partial pressure of TMGa: about 10 mTorr;
Se/Ga (VI/III) molar flow ratio: about 3-4;
temperature: 530-550° C.;
growth time t: between 2 and 5 seconds.

The MOCVD technique is advantageous because it enables good reproducibility and high rates of crystal growth. In addition, it is industrially applicable.

Alternatively, use may be made of other chemical vapour deposition (CVD) techniques, such as atomic layer deposition (ALD).

As has been mentioned previously, following the passivation step, the process comprises a step of epitaxy, of the van der Waals epitaxy type, consisting in epitaxially growing a 2D material on the passivation layer 4 so as to form a two-dimensional buffer layer 5, visible in FIG. 4K. This epitaxy step typically comprises a first step of nucleation and a first step of growth or a step of lateral growth of the nuclei. These steps are detailed below.

The term "lateral growth" means that each nucleus grows by extending mainly in the plane of the passivation layer and more generally the plane on which it was deposited.

In the example shown, the buffer layer 5 is made of gallium selenide structured in sheets (2D GaSe). In other words, the buffer layer 5 comprises at least one 2D GaSe sheet.

The first nucleation step is a step of GaSe nucleation. The GaSe nucleation step is performed by depositing grains 51 of GaSe onto the passivation layer 4, visible in FIGS. 4F and 4G. The GaSe nuclei have an initial width equal to a few tens of nanometres.

To perform the nucleation, the substrate is maintained in the growth chamber and the MOCVD technique is used. The precursors that may be used are the same as for the passivation step. The partial pressures of precursor used are less than those of the passivation step.

The carrier gas is typically hydrogen. Alternatively, it may be nitrogen, argon, or any other inert gas from column VIII of the Periodic Table.

The first nucleation step is generally performed at between 400° C. and 650° C.

The total pressure in the chamber has values typically between 5 and 80 Torr.

The partial pressure of the Ga precursor is generally between 1 and 50 mTorr.

The VI/III molar flow ratio depends on the type of precursor. Typical values are between 3 and 4.

According to a particular embodiment, the conditions of the first nucleation step are as follows:
total pressure in the chamber: 5-20 Torr;
partial pressure of TMGa: about 2-3 mTorr;
Se/Ga (VI/III) molar flow ratio: about 3-4;
temperature: 530-550° C.

The thickness of the nuclei reaches about 8 Å for a growth time $t_1$ of between 2 and 3 seconds.

After nucleation, the GaSe nuclei are grown laterally, over several micrometres, as shown in FIGS. 4H and 4I, until at least one continuous sheet is obtained on the [111] oriented facets 52. Each 2D GaSe sheet is crystallographically oriented relative to the Si(111) surface, as illustrated in FIGS. 4J and 4K.

FIG. 4K represents a buffer layer 5 formed by two GaSe sheets located on the passivation layer 4: a lower sheet 52 and an upper sheet 53. The bonding 54 between the lower sheet 52 and the passivation layer 4 and the bonding 55 between the two sheets 52, 53 are weak van der Waals bonds. The outer surface 56 of the upper sheet 53 has no side bonds.

This first growth step, or step of lateral growth of the GaSe grains, is performed at a lower partial pressure and a higher temperature than the first nucleation step.

The substrate is maintained in the growth chamber.

The first growth step, or lateral growth step, is generally performed at between 570° C. and 650° C.

The total pressure in the chamber has values typically between 5 and 80 Torr.

The partial pressure of the Ga precursor is generally between 0.5 and 5 mTorr.

The VI/III molar flow ratio depends on the type of precursor. Typical values are between 3 and 4.

According to a particular embodiment, the conditions of the first growth step are as follows:
total pressure in the chamber: 5-20 Torr;
partial pressure of TMGa: about 1 mTorr;
Se/Ga (VI/III) molar flow ratio: about 3-4;
temperature: 600-640° C.

The growth time $t_2$ to make the GaSe grains completely coalesce as a continuous sheet is about 200 seconds.

To obtain a continuous 2D GaSe sheet (thickness of about 8 Å), a nucleation time $t_1$ and a lateral growth time $t_2$ are mandatorily required. As $t_2$ is very much longer than $t_1$, $t_1$ can be ignored and as such about 200 seconds are required for one sheet and, by extension;
about 400 seconds are required for two sheets;
about 600 seconds are required for three sheets.

The growth rate is thus of the order of 2-3 Å·min$^{-1}$.

The buffer layer is formed by one (or more) sheets of the 2D material. In the example shown, the buffer layer 5 is formed by two sheets 52 and 53 of 2D GaSe.

The GaSe buffer layer is stable up to about 950° C. It is free of side bonds. It is thus suitable for growth, without mechanical constraints, of semiconductor materials of interest (IV-IV, III-V, II-VI, 2D materials, etc.) by epitaxy, such as GaAs in the example shown.

Depending on the type of semiconductor material of interest to be epitaxially grown, the GaSe two-dimensional buffer layer can be replaced with a two-dimensional buffer layer made of a 2D material other than GaSe, on condition that the step of passivation of the Si(111) with an atomic plane of gallium Ga followed by an atomic plane of selenium Se is conserved. Examples that may be mentioned include one of the following materials: GaS, GaTe, $MoS_2$, $MoSe_2$, $WS_2$, $WSe_2$, InSe. Several different layers from among a combination of the materials mentioned previously may be combined. Preferably, the 2D material is a material that is stable up to 1000° C.

The process then comprises an additional epitaxy step consisting in epitaxially growing a semiconductor material of interest, which is typically a IV-IV, III-V, II-VI semiconductor material or a 2D semiconductor material, on the two-dimensional buffer layer. This additional epitaxy step typically comprises a second nucleation step and a second growth step, which is rapid growth at high temperature. These steps are detailed below.

In the example shown, the semiconductor material of interest is gallium arsenide (GaAs). Thus, the second nucleation step is a step of GaAs nucleation. However, the example is not in any way limiting and the process is the same for another semiconductor material from among IV-IV, III-V, II-VI semiconductor materials or 2D semiconductor materials, etc. A semiconductor material of interest may be chosen from the following materials: GaAs, GaSb, GaN, AlN, or a combination of said materials.

The GaAs nucleation step, shown in FIG. 4L, is performed by selective deposition onto the buffer layer 5 of a nucleation layer 6 made of gallium arsenide (GaAs).

The substrate is maintained in the growth chamber and the MOCVD technique is used.

To obtain GaAs by MOCVD, use is made of organometallic precursors, which are typically TriMethylGallium (TMGa) and Tert-ButylArsine (TBAs), which are gaseous at the working temperature in the process. Alternatively, it may be any other gallium precursor and/or any other arsenic precursor.

The carrier gas is typically hydrogen. Alternatively, it may be nitrogen or helium, or any other inert gas from column VIII of the Periodic Table.

The second nucleation step is generally performed at between 350° C. and 450° C.

The total pressure in the chamber has typical values of between 80 and 600 Torr.

The partial pressure of the gallium precursor is generally between 0.5 and 5 Torr.

The molar flow ratio is generally between 1.5 and 10.

According to a particular embodiment, the conditions of the second nucleation step are:
total pressure in the chamber: 200-450 Torr;
time: 200-400 seconds;
partial pressure of TMGa: about 1.5 Torr;
As/Ga molar flow ratio: about 2.5;
temperature: 370-390° C.

The second growth step, shown in FIG. 4M or in FIG. 4N, takes place vertically in the trench. The substrate is maintained in the growth chamber.

The temperature is increased to make the GaAs nuclei coalesce and to start the step of rapid growth of the GaAs at high temperature and low pressure, which makes it possible to obtain a localized layer of GaAs of excellent crystalline quality.

The second growth step is generally performed at between 550° C. and 670° C.

The total pressure in the chamber has typical values of between 5 and 80 Torr.

The partial pressure of the gallium precursor is generally between 10 and 50 mTorr.

The molar flow ratio is generally between 2.5 and 15.

According to a particular embodiment, the conditions of the second growth step are:
total pressure in the chamber: 20 Torr;
time: 300 seconds;
partial pressure of TMGa: about 30 mTorr;
As/Ga molar flow ratio: about 3.5;
temperature: 570-630° C.

A structure is thus obtained comprising:
a silicon substrate 1;
a plurality of masking patterns 20 located on the silicon substrate 1, two masking patterns being separated by a trench 21;
a passivation layer 4 located in each trench;
a two-dimensional buffer layer 5 located on the passivation layer 4 in each trench;
a layer 61, 62 of a semiconductor material of interest located on the two-dimensional buffer layer 5 and filling at least each trench, said layer of a semiconductor material of interest having a density of threading dislocations of less than $10^6/cm^2$.

Preferably, the semiconductor material of interest is a IV-IV, III-V, II-VI semiconductor material and/or a 2D semiconductor material.

Preferably, the masking patterns are made of a dielectric material.

In addition, the layer 61 of semiconductor material of interest may be confined in the trenches, as illustrated in FIG. 4M. Alternatively, the layer 62 of semiconductor material of interest may be widened by lateral growth outside of each trench, for example to form a horizontal nanowire of square cross-section, as illustrated in FIG. 4N.

In addition, the layer of semiconductor material of interest is preferably of [100] orientation.

Since the buffer layer of two-dimensional material does not comprise any side bonds, it may then function as a universal substrate for the localized growth of the semiconductor of interest with a reduced defect content (notably a reduced density of threading dislocations) and thus having optimized physicochemical properties. Specifically, contrary to direct growth on a silicon substrate, growth on the buffer layer of two-dimensional material makes it possible to overcome the problem of the difference in lattice parameters. It is achieved with no (or with very few) covalent bonds at the interface, by promoting van der Waals growth, thus enabling the formation of an unconstrained material, which avoids the process of relaxation by generation of threading dislocations. This thus makes it possible to form a layer of a semiconductor material of interest which is a crystalline material with a density of threading dislocations of less than $10^6/cm^2$. The semiconductor material of interest is preferably a monocrystalline material.

In addition, the selective growth, i.e. without the trenches between the masking patterns, of a 3D semiconductor material (GaAs, GaN, etc.) on a 2D material makes it possible to concentrate the nucleation on a very limited number of areas of the substrate: the nucleation density is thereby considerably enhanced and notably allows the growth of a continuous layer of a 3D material on a 2D material.

The present invention is not limited to the embodiments described previously, but extends to any embodiment falling within the scope of the claims.

Among the numerous applications of the invention, mention may be made of microelectronics, photonics, sensors, radiofrequency-related technologies, electromechanical microsystems (MEMS), Internet-of-things components, battery chargers, high-voltage components, microprocessors, static and dynamic memories, photovoltaics, and more broadly anything concerning "more than Moore" technologies or derivative technologies, i.e. technologies which integrate several functions on the same silicon chip.

The invention claimed is:

1. A process for the hetero-integration of a semiconductor material of interest on a silicon substrate, comprising:
a step of removing a native oxygen from the silicon substrate;

a step of structuring the substrate which comprises a step of producing a growth mask on the surface of the silicon substrate, said growth mask comprising a plurality of masking patterns, two masking patterns being separated by a trench wherein the silicon substrate is exposed;

a step of forming a two-dimensional buffer layer made of a 2D material, said buffer layer being free of side bonds on its free surface and being formed selectively on a silicon plane of [111] orientation in at least one trench, said step of forming a buffer layer being performed after the structuring step and being performed by an organometallic vapour deposition (MOCVD) technique;

a step of forming at least one layer of a semiconductor material of interest on the buffer layer; and a passivation step which consists in depositing an atomic biplane of gallium and selenium onto the silicon plane of [111] orientation so as to form a silicon-gallium-selenium passivated surface on said plane.

2. The process according to claim 1, the semiconductor material of interest being a IV-IV, III-V, II-VI semiconductor material and/or a 2D semiconductor material.

3. The process according to claim 1, the masking patterns being made of a dielectric material.

4. The process according to claim 1, the silicon substrate being a silicon (Si(001)) substrate of [001] orientation and the structuring step also comprising a step of forming at least one silicon facet of [111] orientation in the silicon substrate, so as to form at least a silicon plane of [111] orientation, the facet being produced through a trench.

5. The process according to claim 4, the facet having an inclined surface with an angle of less than 90° relative to the surface of the substrate wherein said facet is formed.

6. The process according to claim 5, two silicon facets of [111] orientation being formed in a trench, each facet having an inclined surface with an angle of less than 90° relative to the surface of the substrate in which said facet is formed.

7. The process according to claim 1, the passivation step being performed between the structuring step and the step of forming the buffer layer.

8. The process according to claim 1, wherein the step of forming at least one buffer layer consists of van der Waals epitaxy and comprises:

a first step of nucleating a 2D material on the passivated surface; and a first step of growth of the nuclei obtained on conclusion of the first nucleation step.

9. The process according to claim 1, the step of preparing at least one layer of a semiconductor material of interest consisting of an additional epitaxy step comprising:

a second step of nucleating the semiconductor of interest on the buffer layer; and a second step of growth of the nucleation layer obtained on conclusion of the second nucleation step.

10. The process according to claim 1, the width of a trench being less than or equal to 20 µm, preferably less than or equal to 2 µm.

11. The process according to claim 1, the 2D material of the buffer layer being chosen from GaSe, GaS, GaTe, $MoS_2$, $MoSe_2$, $WS_2$, $WSe_2$, InSe or a combination of said materials.

12. The process according to claim 1, the semiconductor material of interest being chosen from GaAs, GaSb, GaN and AlN.

13. A structure obtained via the hetero-integration process according to claim 1 and comprising:

a silicon substrate;

a plurality of masking patterns located on the silicon substrate, two masking patterns being separated by a trench;

a two-dimensional buffer layer located in each trench; and a layer of a semiconductor material of interest located on the two-dimensional buffer layer and at least in each trench, said layer of a semiconductor material of interest having a density of threading dislocations of less than $10^6/cm^2$; and a passivation layer made of silicon-gallium-selenium between the silicon substrate and the two-dimensional buffer layer.

14. The structure according to claim 13, the semiconductor material of interest being a IV-IV, III-V, II-VI semiconductor material and/or a 2D semiconductor material.

15. The structure according to claim 13, the layer of a semiconductor material of interest filling each trench and also extending outside each trench, for example to form a horizontal nanowire.

16. The structure according to claim 13, the layer semiconductor material of interest being a monocrystalline material.

* * * * *